United States Patent
Gluschenkov et al.

(10) Patent No.: US 6,667,197 B1
(45) Date of Patent: Dec. 23, 2003

(54) METHOD FOR DIFFERENTIAL OXIDATION RATE REDUCTION FOR N-TYPE AND P-TYPE MATERIALS

(75) Inventors: Oleg Gluschenkov, Wappingers Falls, NY (US); Bruce B. Doris, Brewster, NY (US); Omer H. Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/314,499

(22) Filed: Dec. 6, 2002

(51) Int. Cl.[7] .................. H01L 21/00; H01L 21/84
(52) U.S. Cl. .................. 438/165; 438/770; 438/198
(58) Field of Search .................. 438/165, 198, 438/197, 585, 770, 787, 788, 771

(56) References Cited

U.S. PATENT DOCUMENTS

| | | |
|---|---|---|
| 5,238,849 A | 8/1993 | Sato |
| 5,412,246 A | 5/1995 | Dobuzinsky et al. |
| 5,443,863 A | 8/1995 | Neely et al. |
| 5,700,699 A | 12/1997 | Han et al. |
| 5,738,909 A | 4/1998 | Thakur et al. |
| 5,946,588 A | 8/1999 | Ahmad et al. |
| 6,358,867 B1 * | 3/2002 | Tews et al. .......... 438/771 |

OTHER PUBLICATIONS

"Silicon Processing for the VLSI Era, vol. 1: Process Technology," by S. Wolf and R.N. Tauber, 2nd edition, Lattice Press, Sunset Beach, California, 2000, pp. 198–207, 213–215.

* cited by examiner

*Primary Examiner*—David Nhu
(74) *Attorney, Agent, or Firm*—Margaret A. Pepper

(57) ABSTRACT

A method of forming a substantially uniform oxide film over surfaces with different level of doping and/or different dopant type is disclosed. In one aspect, a method for forming a uniform oxide spacer on the sidewalls of heavily doped n- and p-type gates is disclosed. The method includes providing a semiconductor substrate having at least two regions with dissimilar dopant characteristics, optionally heating the substrate; and forming a uniform oxide layer over the at least two regions by exposing the substrate to a gaseous mixture including atomic oxygen.

11 Claims, 2 Drawing Sheets

US 6,667,197 B1

METHOD FOR DIFFERENTIAL OXIDATION RATE REDUCTION FOR N-TYPE AND P-TYPE MATERIALS

FIELD OF THE INVENTION

This invention relates generally to the manufacture of high speed semiconductor microprocessors, application specific integrated circuits (ASICs), and other high speed integrated circuit devices. More particularly, this invention relates to a method of forming a uniform thermally grown oxide layer over surfaces with high doping level and different doping type.

BACKGROUND OF THE INVENTION

Since its invention in the 1960's, the thermal oxidation of silicon is considered to be the enabling process for modern integrated circuits. After more than four decades of extensive investigation, there is a vast art on various aspects of the thermal oxidation and its applications to the fabrication of integrated circuits and other microstructures. Several key properties of thermal oxidation distinguish it from other methods of forming dielectric on semiconductor. These include: (1) a nearly electrically perfect interface between silicon and silicon oxide; (2) high dielectric strength of the oxide; and (3) excellent control of the uniformity of the oxide film.

These properties have enabled the use of thermal oxide as, for example, the gate dielectric, the isolator in various LOCOS (local isolation of silicon) structures, the isolator for various IT (isolation trench) structures, the gate sidewall isolator/spacer, and the screen oxide for ion implantation.

The kinetics of thermal oxidation are well understood. The Deal-Grove (linear-parabolic) model provides an insight into physical and chemical processes occurring during the thermal oxidation of silicon. The model was put forward in the 1960's as a physical interpretation of experimental data, and since then its validity has been repeatedly confirmed. According to this model, the oxide growth rate is limited by the speed of the interface reaction in the thin film regime. (The oxide film is less than about 500 angstrom.) Consequently, the oxidation rate is greatly affected by doping level and type. Indeed, the presence of a large amount of dopant alters the free energy of the silicon interface, changing the rate of interfacial chemical reactions. In addition, dopant type (n or p) affects the free energy in different ways. The dependence of the oxide growth rate on doping level and type is often referred to in the art as "the dopant effect." For instance, the dependence of the oxidation rate on phosphorus doping level is illustrated in "*Silicon Processing for the VLSI Era, Volume 1: Process Technology*," by S. Wolf and R. N. Tauber, 2nd edition, Lattice Press, Sunset Beach, Calif., 2000, pp. 198–207, 213–215. The data show a rapid increase of the oxidation rate in the thin film regime while there is a negligible dopant effect in the parabolic, thick film regime. As the concentration of phosphorus increases from $1\times10^{19}$ to $1\times10^{21}$ cm$^{-3}$, the growth rate increases in excess of 1000 percent. There is a negligible dopant effect for a phosphorus concentration below $1\times10^{19}$ cm$^{-3}$. The oxidation art teaches that the dopant effect is fundamental in nature, and therefore cannot be eliminated by simply changing either the type of oxidation tool (e.g., horizontal furnace, vertical furnace, rapid thermal processor) or the oxidation ambient (e.g., dry, wet, high pressure, low pressure).

The dopant effect can pose a serious obstacle to the fabrication of a uniform thermal oxide film over a silicon surface with different doping level and type. Therefore, there is a need in the art for a versatile oxidation method with reduced dopant effect.

U.S. Pat. No. 5,412,246 to Dubuzinsky et al. describes plasma assisted oxidation of silicon and silicon nitride performed at a low plasma power. Dubuzinsky et al. teach that a high power plasma oxidation may cause damage to the grown oxide film. Therefore, a low plasma power process was selected to produce high-quality oxide films. Dubuzinsky et al. also disclose useful embodiments such as a low-temperature method of forming an oxide spacer on a doped gate. However, Dubuzinsky et al. do not disclose anything about the uniformity of the oxide spacer as a function of doping concentration in the gate, nor do they teach anything about the uniformity of the oxide spacer as a function of gate doping type.

U.S. Pat. No. 5,443,863 to Neely et al. describes a low temperature plasma assisted oxidation process. The plasma is created up stream of the processing zone with a microwave plasma electrical discharge. Neely et al. teach that such oxidation process can be conducted at a temperature below 300° C. Neely et al. describe a useful embodiment where a silicon carbide film is oxidized at a low temperature. However, Neely et al. do not discuss the dopant effect of the disclosed process, nor do they describe application of their process to structures with varying high dopant level or type.

U.S. Pat. No. 5,946,588 to Ahmad et al. describes a method of forming gate oxide. Ahmad et al. teach a thermal oxidation process where a silicon surface is oxidized in a low-temperature sub-atmospheric ozone ambient. Inherently, gate oxides are grown on lightly doped substrates and are not subjected to the oxidation doping effect. Therefore, Ahmad et al. specify a preferred range of doping level of $3\times10^{16}$ to $5\times10^{17}$ cm$^{-3}$, far lower than the range investigated in the present application ($1\times10^{19}$ to $1\times10^{22}$ cm$^{-3}$). Moreover, Ahmad et al. do not discuss the uniformity of the oxide film as a function of doping concentration in the substrate, nor do they discuss any other aspects of the doping effect.

U.S. Pat. No. 5,738,909 to Thakur et al. describes a method of forming thin oxides on a semiconductor substrate. Thakur et al. teach a method where a portion of the oxidation process is conducted in an ozone ambient in order to increase the oxide growth rate. In addition, Thakur et al. teach that ultraviolet radiation can speed up the oxidation process even further. Thakur et al. do not teach anything about the uniformity of the oxide film as a function of doping concentration in the substrate, nor do they discuss any other aspects of the doping effect.

U.S. Pat. No. 5,700,699 to Han et at describes a method of forming gate oxide for thin film transistor (TFT). The gate oxide is formed with plasma assisted oxidation. The plasma is created with the aid of electron cyclotron resonance electrical discharge (ECE). Inherently, gate oxides are grown on a lightly doped semiconductor and are not subjected to the oxidation doping effect. Even though Han et al do not specify a preferred range of doping level, the doping level of the transistor channel is known to be typically less than $5\times10^{18}$ cm$^{-3}$, a range far lower than the one investigated in the present application ($1\times10^{19}$ to $1\times10^{22}$ cm$^{-3}$). Consequently, Han et al. do not teach anything about the uniformity of the oxide film as a function of doping concentration in the substrate, nor do they discuss any other aspects of the doping effect.

U.S. Pat. No. 5,238,849 to Sato describes a method of fabricating a bipolar transistor. Sato teaches a method of forming an oxide layer between the crystalline base and polycrystalline emitter. The layer is formed with oxygen ions resulting in a substoichiometric silicon oxide. Sato does not teach anything about the uniformity of the oxide film as a function of doping concentration in the crystalline base, nor does he discuss any other aspects of the doping effect.

U.S. Pat. No. 6,358,867 to Tews et al., the disclosure of which is incorporated herein by reference, describes an orientation independent oxidation of silicon. Tews et al. teach a thermal oxidation method where a substantially uniform silicon oxide film is grown on various crystallographic planes of silicon. The main advantage of the method is achieved by employing atomic oxygen as the main oxidizing agent. Tews et al. also teach that the orientation effect is mainly due to the different surface density of silicon atoms on different crystallographic planes. As a result, the speed of the surface reaction is proportional to the surface density of silicon atoms in the thin-film (linear) regime leading to the orientation-dependent oxidation rate. In other words, Tews et al. provide an oxidation method that allows for a substantial reduction of the dependence of oxidation rate on the surface density of silicon atoms in the thin-film regime. Tews et al. do not teach an oxidation method that would allow for a substantial reduction of the dependence of the oxidation rate on the free energy of silicon interface. The surface concentration of atoms in the case of highly doped n-type material is very close to the surface concentration of pure Si plane of the same crystallographic orientation. Consequently, Tews et al. provide no suggestion regarding how to reduce the doping dependence of the oxidation rate.

Thus, there remains a need in the art for an oxidation method with reduced dopant effect.

SUMMARY OF THE INVENTION

The aforementioned problems associated with the dopant effect are greatly reduced by the method of forming an oxide layer disclosed herein. The method comprises the steps of. (1) providing a semiconductor substrate having at least two regions with dissimilar dopant characteristics; and (2) forming a uniform oxide layer over the at least two regions by exposing the substrate to a gaseous mixture comprising atomic oxygen and molecular oxygen, wherein the ratio of atomic oxygen to molecular oxygen is about 0.000001 to 100. The method optionally includes the additional step of heating the substrate to a temperature of about 300° C. to 1100° C.

In a particularly preferred embodiment, the method comprises the steps of: (1) providing a semiconductor substrate, the semiconductor substrate having at least two regions, the at least two regions having similar doping concentrations, the first region being doped with boron and the second region being doped with phosphorus; (2) heating the substrate to a temperature of about 300° C. to 1100° C.; and (3) forming a uniform oxide layer over the at least two regions by exposing the substrate to a gaseous mixture having a concentration of atomic oxygen greater than about $1 \times 10^{11}$ $cm^{-3}$ and a concentration of molecular oxygen less than about $1 \times 10^{18}$ $cm^{-3}$.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Figure 3:
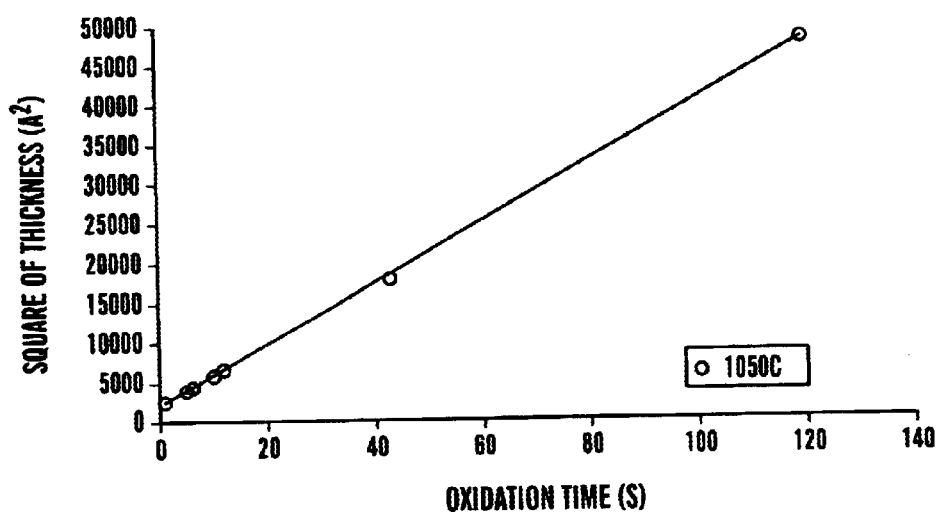
FIG. 3 is a graph illustrating oxidation process time as a function of thickness of grown oxide film.

It has been surprisingly discovered that thermal oxidation with atomic oxygen can be performed substantially free from the dopant effect. Contrary to the prior art teaching, it has been found that atomic oxygen survives its trip from the gaseous ambient to the silicon/silicon oxide interface. As a result, the surface reaction at the interface can be sped up to the point that the overall rate of oxide growth is limited with the rate of atomic oxygen diffusion through the oxide film. Oxygen radicals present in the silicon oxide film have an unusual coexistence of (1) high chemical activity (ability to quickly engage in a chemical reaction) and (2) relative stability (absence of recombination). Therefore, the oxidation process can be conducted entirely in the diffusion-limited regime resulting in the absence of the dopant effect associated with varying surface reaction rate. FIG. 3 shows that the oxidation process time as a function of the thickness of grown oxide film follows a parabolic dependence. The parabolic dependence is the earmark of diffusion-limited oxidation. Therefore, it has been discovered that the atomic oxidation is diffusion limited even in the thin-film regime.

The absence of the dopant effect is particularly useful for growing a substantially uniform oxide film over surfaces with different level of doping and/or different dopant type. In one aspect, the invention includes a method for forming a uniform oxide spacer on the sidewalls of heavily doped n- and p-type gates.

Figure 1:
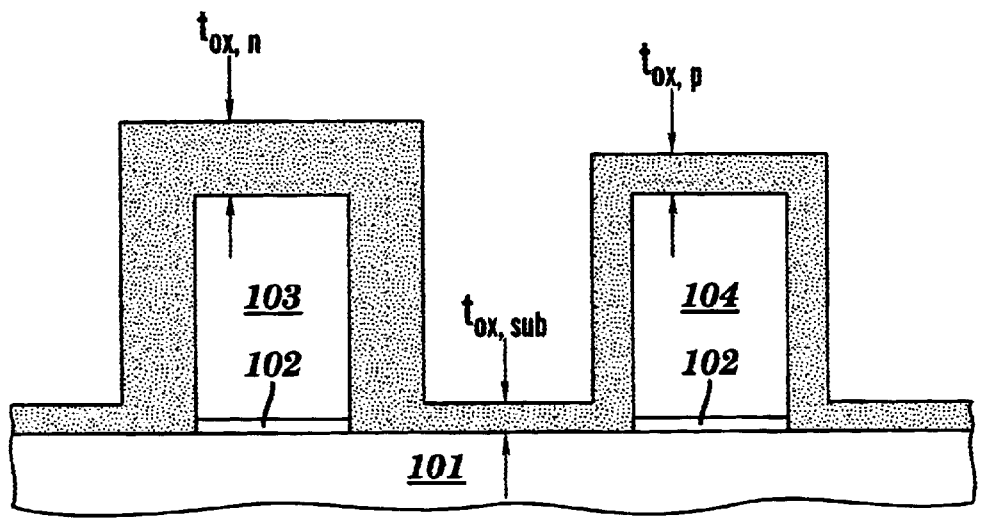
FIG. 1 is a schematic illustration of a high-performance CMOS integrated circuit having a thermal oxide spacer formed in accordance with a method of the prior art.

FIG. 1 schematically illustrates a high-performance CMOS integrated circuit where a plurality of high-performance NFETs and a plurality of high-performance PFETs are combined on the same substrate 101. For clarity, only one NFET and one PFET are shown. The NFET and PFET structures have a gate insulator 102, the respective gate stacks 103 and 104, and a thermal oxide spacer 105. The PFET gate stack 104 is doped with a p-type dopant (e.g., boron) such that the dopant concentration is above $1 \times 10^{19}$ $cm^{-3}$, preferably above $1 \times 10^{20}$ $cm^{-3}$. The NFET gate stack 103 is doped with a n-type dopant (e.g., phosphorus) such that the dopant concentration is above $1 \times 10^{19}$ $cm^{-3}$, preferably above $1 \times 10^{20}$ $cm^{-3}$. The concentration of dopants on exposed portions of substrate 101 does not exceed $1 \times 10^{18}$ $cm^{-3}$. In accordance with the prior art, the thermal oxide spacer 105 has different thickness in various parts of the circuit due to the doping oxidation effect, as follows.

$$t_{ox.n} \neq t_{ox.p} \neq t_{ox.sub}$$

In one embodiment of this invention, a method for forming a high-performance CMOS circuit with gate pre-doping is disclosed. When forming CMOS circuits with gate pre-doping, the gate electrode is typically doped prior to the formation of gate spacers. FIG. 1 illustrates a typical CMOS structure with gate pre-doping process. After formation of a gate insulator 102 on substrate 101, the gate stacks 103 and 104 are formed, patterned and etched. The gate stacks 103 and 104 consist of a silicon-containing gate electrode which contacts the gate insulator 102. The gate stack optionally may contain a metallic gate conductor (not shown) formed in the upper portion of the stack. An optional diffusion barrier (not shown) also may be inserted in between the gate conductor and the gate electrode. The gate stack also may have a hard mask (not shown) formed on the top of the gate stack. The silicon-containing gate electrode is typically made of polycrystalline silicon but also may include germanium and/or carbon. The doping of the gate electrode is conducted prior to the spacer formation. In one method, the gate electrode can be selectively doped with p-type and n-type dopants immediately after the deposition process. The selective doping is accomplished with the use of photoresist block masks. The gate electrode is doped to a very high level to reduce the gate electrode depletion effect. The depletion effect reduces the overall device performance by effectively thickening the gate insulator. The typical doping range of both NFET and PFET gate electrodes is from $1 \times 10^{19}$ to $5 \times 10^{21}$ cm$^{-3}$, preferably from $1 \times 10^{20}$ to $5 \times 10^{21}$ cm$^{-3}$ oxide spacer 105 is grown on highly-doped gates with different type and exposed portions of the substrate with relatively low doping. As the result, the thickness of the oxide spacer varies more than 50%. The varying oxide spacer thickness is the well-known problem of the gate pre-doping fabrication scheme.

Figure 2:
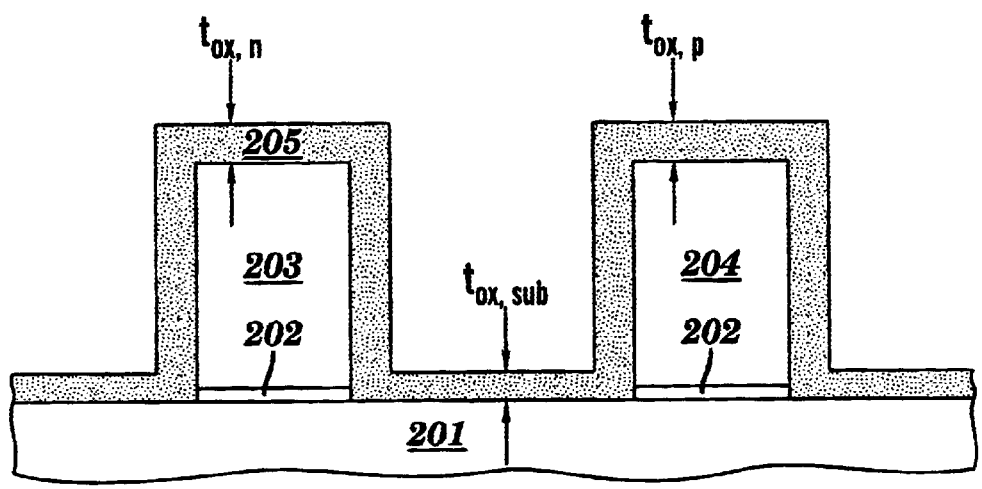
FIG. 2 is a schematic illustration of a high-performance CMOS integrated circuit having a thermal oxide spacer formed in accordance with the method of the present invention.

The doping independent oxidation method of this invention eliminates the above-mentioned problem of varying spacer thickness and enables the pre-doping fabrication scheme. FIG. 2 shows a high-performance CMOS structure with the gate pre-doping. Like FIG. 1, FIG. 2 schematically illustrates a high-performance CMOS integrated circuit where a plurality of high-performance NFETs and a plurality of high performance PFETs are combined on the same substrate 201. For clarity, only one NFET and one PFET are shown. The NFET and PFET structures have a gate insulator 202, the respective gate stacks 203 and 204, and a thermal oxide spacer 205.

The PFET gate stack 204 is doped with a p-type dopant (e.g., boron) such that the dopant concentration is above $1 \times 10^{19}$ cm$^{-3}$, preferably above $1 \times 10^{20}$ cm$^{-3}$. The NFET gate stack 203 is doped with a n-type dopant (e.g., phosphorous) such that the dopant concentration is above $1 \times 10^{19}$ cm$^{-3}$, preferably above $1 \times 10^{20}$ cm$^{-3}$. The concentration of dopants on exposed portions of substrate 201 does not exceed $1 \times 10^{18}$ cm$^{-3}$. Alternatively, gate stacks 203 and 204 may each be doped with the same dopant (e.g., phosphorous), but have significantly different dopant concentrations. For example, gate stack 203 may have a doping level of about $1 \times 10^{19}$ cm$^{-3}$ and gate stack 204 may have a doping level significantly greater than about $1 \times 10^{19}$ cm$^{-3}$.

Unlike FIG. 1, however, the thermal oxide spacer 205 in FIG. 2 is formed with the doping independent process of this invention. As a result, the spacer has substantially the same thickness in various portions of the circuit, as follows. By "substantially the same thickness" it is meant that the thickness variation is less than 20%.

$$t_{ox.n} \approx t_{ox.p} \approx t_{ox.sub}$$

The preferred process for forming thermal oxide spacers on pre-doped gates 2 5 comprises the following steps: (1) providing pre-doped gates; (2) generating an atomic oxygen-containing mixture; (3) oxidizing the pre-doped gates in the presence of the mixture; and (4) performing an optional thermal treatment. In the optional thermal treatment, the substrate is heated to a temperature of about 300° C. to 1100° C.

The atomic oxygen-containing mixture is preferably generated in a chemical, photochemical or remote plasma process such that gates are not directly exposed to the plasma. One known method of generating an atomic oxygen-containing mixture is to mix molecular hydrogen (H$_2$) and molecular oxygen (O$_2$) at a low pressure, e.g., less than about 30 Torr. This process is known as in-situ steam generation (ISSG) or free radical enhanced rapid thermal oxidation (FRE RTO). In this ISSG process, the temperature is preferably about 850 to 900° C., the pressure is preferably about 10 Torr, the amount of hydrogen is preferably about 10% by number density or partial pressure (i.e., 1 Torr of H$_2$ and 9 Torr of O$_2$ for a total pressure of 10 Torr), and the processing time is preferably less than about 10 seconds. The atomic oxygen-containing mixture may further include one or more noble gases or carrier gases.

In the atomic oxygen-containing mixture, the ratio of atomic oxygen to molecular oxygen is preferably about 0.000001 to 100, more preferably 0.000001 to 10. In the preferred embodiment of FRE RTO or ISSG oxidation, the dissociation rate is about 0.1 to 0.01%, which corresponds to a ratio of atomic oxygen to molecular oxygen of about 0.001 to 0.0001. Since the preferred pressure of the mixture is 10 Torr, the partial pressure of atomic oxygen is 1–10 mTorr. This small amount of atomic oxygen is able to support the oxide differential growth rate of 1–3 Å/sec which is about 15 times faster than the oxidation rate in pure (dry) molecular oxygen at 760 Torr in the linear regime. Therefore, in order to achieve a growth rate of atomic oxidation of at least 10 times faster than that of molecular oxidation, one can take 1–10mTorr of atomic oxygen and 760–1000 Torr of molecular oxygen, which would result in a ratio of atomic oxygen to molecular oxygen of about 0.000001 to 0.00001.

Alternatively, one can produce atomic oxygen in a plasma discharge. Efficient plasma discharges operate at a low pressure, typically 1–200 mTorr with a relatively high fraction of dissociation of the order of 10%. In fact, one can easily dissociate almost all molecular oxygen in an optimized low pressure discharge.

Therefore, the fraction of dissociation can vary over many orders of magnitude from 0.0001 to 100 percent. The fraction of dissociation, α, is defined as the number of dissociated oxygen molecules or half of oxygen atoms to the original number of oxygen molecules or the resultant number of oxygen molecules plus half of oxygen atoms:

The atomic oxygen to molecular oxygen ratio is related to the fraction of dissociation as follows:

When alpha is small the atomic oxygen to molecular oxygen ratio is simply 2α. When the fraction of dissociation approaches 1 or 100% the atomic oxygen to molecular oxygen ratio approaches infinity.

In practice, it is extremely hard to achieve a fraction of dissociation above 98%, therefore one can put a limit of 100 on the ratio of atomic oxygen to molecular oxygen.

Furthermore, there is no particular technical need of achieving such fraction of dissociation. In fact, a fraction of dissociation of 0.8 can be considered very high as compared to the typical range of 0.1–0.4 observed in high-electron-density discharges. Therefore, the preferred range for the ratio of atomic oxygen to molecular oxygen can be slightly narrowed to 0.000001–10.

There are many ways to measure the concentration of atomic oxygen. One indicator of atomic oxygen concentration is the speed of a chemical reaction (the oxide growth rate). The high chemical potential of atomic oxygen (~2 eV) can speed up the chemical reaction at a typical temperature range of 300–1500K by as much as 30 orders of magnitude. One can also use optical spectroscopy of plasma to determine ppm and ppb level of various species in the plasma.

The atomic oxygen content in the mixture can be specified in terms of (a) impinging flux 0) of atomic oxygen onto the substrate; or (b) partial pressure (p) of atomic oxygen in the close proximity of the substrate; or (c) concentration of atomic oxygen (n) in the close proximity of the substrate. Parameters (b) and (c) are related through the perfect gas (Boltzmann) relationship:

$$p=nkT$$

where T is the gas temperature, and k is the Boltzmann constant. They can be used as a measure of atomic oxygen content when the oxygen atom mean free pass is much smaller than the characteristic chamber dimension. In addition, the parameter (a) is related to (c) through the well-known relationship:

where v is the average speed of oxygen atom. In molecular beam chambers, the mean free pass is larger than the characteristic chamber dimension. In these chambers, the atomic oxygen is delivered in forms of atomic/molecular beams where the concept of pressure is not adequate. In this case, the parameter (a) can be used to describe the atomic oxygen content. For the purpose of this invention, the minimal content of atomic oxygen in the atomic-oxygen-containing mixture is the amount of atomic oxygen measured in terms of either (a), (b) or (c) such that it is enough to grow at least 90% of required oxide film at a given process temperature and time. In other words, the growth rate of atomic oxidation is at least 90% of the observed growth rate. It is noted that the fraction of dissociation can vary over several orders of magnitude while still satisfying the condition on minimal amount of atomic oxygen. For instance, wet (water vapor) molecular oxidation at about 10 Torr and about 900° C. allows for the growth rate of approximately 0.05 Å/sec in the linear regime. In order to satisfy the minimal atomic oxygen requirement, the atomic oxidation rate should be at least 0.5 Å/sec at about 900° C. This oxidation rate (0.5 Å/sec at 900° C.) can be supported by approximately $1\times10^{12}$ cm$^{-3}$ of atomic oxygen in the vicinity of the wafer surface, which is equivalent to about 0. 12 mTorr of atomic oxygen partial pressure, or about $4.3\times10^{16}$ cm$^{-2}$ s$^{-1}$ atomic oxygen flux impinging on the wafer surface. It is noted that the minimal fraction of dissociation in this case is approximately 0.001%.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method of forming an oxide layer, the method comprising:

providing a semiconductor substrate having at least two regions with dissimilar dopant characteristics; and forming a uniform oxide layer over the at least two regions by exposing the substrate to a gaseous mixture comprising atomic oxygen and molecular oxygen, wherein the ratio of atomic oxygen to molecular oxygen is about 0.000001 to 100.

2. The method of claim 1, wherein the at least two regions have similar doping concentrations, and wherein a first of the two regions is doped with boron and a second of the two regions is doped with phosphorus.

3. The method of claim 1, wherein the at least two regions are each doped with phosphorus, and wherein a first of the two regions has a doping level of about $1\times10^{19}$ cm$^{-3}$ and a second of the two regions has a doping level significantly greater than about $1\times10^{19}$ cm$^{-3}$.

4. The method of claim 1, wherein the gaseous mixture has a concentration of atomic oxygen greater than about $1\times10^{11}$ cm$^{-3}$ and a concentration of molecular oxygen less than about $1\times10^{18}$ cm$^{-3}$.

5. The method of claim 1, further comprising the step of heating the substrate to a temperature of about 300° C. to 1100° C.

6. The method of claim 4, wherein the concentration of atomic oxygen is about $1\times10^{12}$ cm$^{-3}$.

7. The method of claim 1, wherein the gaseous mixture has a partial pressure of atomic oxygen of about 0.12 mTorr.

8. The method of claim 1, wherein the impinging flux of atomic oxygen on the substrate is about $4.3\times10^{16}$ cm$^{-2}$s$^{-1}$.

9. The method of claim 1, wherein the gaseous mixture of atomic oxygen and molecular oxygen is formed using an in-situ steam generation (ISSG) process using molecular hydrogen ($H_2$) and molecular oxygen ($O_2$).

10. The method of claim 9, wherein the temperature is about 850 to 900° C., the pressure is about 10 Torr, the amount of hydrogen is about 10% by number density, and the processing time is less than about 10 seconds.

11. A method of forming an oxide layer, the method comprising:

providing a semiconductor substrate, the semiconductor substrate having at least two regions, the at least two regions having similar doping concentrations, a first region being doped with boron and a second region being doped with phosphorus;

heating the substrate to a temperature of about 300° C. to 1100° C.; and forming a uniform oxide layer over the at least two regions by exposing the substrate to a gaseous mixture having a concentration of atomic oxygen greater than about $1\times10^{11}$ cm$^{-3}$ and a concentration of molecular oxygen less than about $1\times10^{18}$ cm$^{-3}$.

* * * * *

UNITED STATES PATENT AND TRADEMARK OFFICE
CERTIFICATE OF CORRECTION

PATENT NO. : 6,667,197 B1
DATED : December 23, 2003
INVENTOR(S) : Oleg Gluschenkov, Bruce B. Doris and Omer H. Dokumaci It is certified that error appears in the above-identified patent and that said Letters Patent is hereby corrected as shown below:

Column 6,
Line 40, the following should appear:

$$\alpha = \frac{[O]}{2[O_2]+[O]}$$

Line 46, the following should appear:

$$\frac{[O]}{[O_2]} = \frac{2\alpha}{1-\alpha}$$

Column 7,
Line 29, the following should appear:

$$j = \frac{nv}{4}$$

Signed and Sealed this

Sixth Day of April, 2004

JON W. DUDAS
*Acting Director of the United States Patent and Trademark Office*